United States Patent [19]

Bhagwan

[11] Patent Number: 5,661,419
[45] Date of Patent: Aug. 26, 1997

[54] DYNAMIC PHASE-FREQUENCY DETECTOR CIRCUIT

[75] Inventor: Raghunand Bhagwan, Sunnyvale, Calif.

[73] Assignee: Sun Microsystems, Inc., Mountain View, Calif.

[21] Appl. No.: 652,839

[22] Filed: May 23, 1996

[51] Int. Cl.⁶ .......................... G01R 25/00; H03D 13/00
[52] U.S. Cl. ................................. 327/8; 327/7; 327/41; 327/157
[58] Field of Search .................................. 327/2, 3, 4, 5, 327/7, 8, 10, 12, 39–43, 155–158, 162, 163; 331/11; 375/375, 376

[56] References Cited

U.S. PATENT DOCUMENTS

| | | | |
|---|---|---|---|
| 4,322,643 | 3/1982 | Preslar | 327/5 |
| 4,354,124 | 10/1982 | Shima et al. | 327/12 |
| 4,814,726 | 3/1989 | Byrd et al. | 327/7 |
| 4,970,475 | 11/1990 | Gillig | 327/3 |
| 5,095,287 | 3/1992 | Irwin et al. | 327/3 |
| 5,376,847 | 12/1994 | Staszewski | 327/3 |
| 5,592,109 | 1/1997 | Notani et al. | 327/3 |

OTHER PUBLICATIONS

Notani, H. et al., *A 622–Mhz CMOS Phase–Locked Loop with Precharge–type Phase Frequency Detector*, Symposium on VLSI Circuits Digest of Technical Papers, (1994 IEEE) pp. 129–130.

Jeong, D. et al., *Design of PLL–Based Clock Generation Circuits*, IEEE Journal of Solid–State Circuits, vol. SC–22, No. 2 (Apr., 1987 IEEE).

Jordan, P. *An Exclusive–OR Phase/Frequency Detector*, Proceedings of the RF EXPO EAST 1989, Atlantic City, N.J., (Oct. 24–26, 1989) pp. 223–229.

*Primary Examiner*—Toan Tran
*Attorney, Agent, or Firm*—Hopkins & Carley

[57] ABSTRACT

A sequential phase-frequency detector circuit using precharged logic and a minimum number of transistors is suitable for use in a delay locked loop because of insensitivity to a stuck delay line output signal. The detector receives standard REFERENCE and LOCAL input signals and provides UP and DOWN output signals for control of a charge pump. In one embodiment, the detector includes a pulse generator for isolating the reset of the UP output signal from a stuck delay line output. This feature permits the UP output to be turned ON while the LOCAL input is stuck at a high level. The circuit exhibits improved gain at phase differences of less than 20 pico-seconds, resulting in reduced phase jitter. The isolating feature minimizes frequency acquisition time in applications in which the frequency of the REFERENCE signal is sometimes substantially reduced, such as during an Energy-Star™ power-conserving or Slow modes, which typically causes the delay line output to become stuck. These features make the detector desirable for use in VLSI clock regeneration circuits where high operating frequencies and tight layout restrictions place a premium on circuit size and performance.

19 Claims, 5 Drawing Sheets

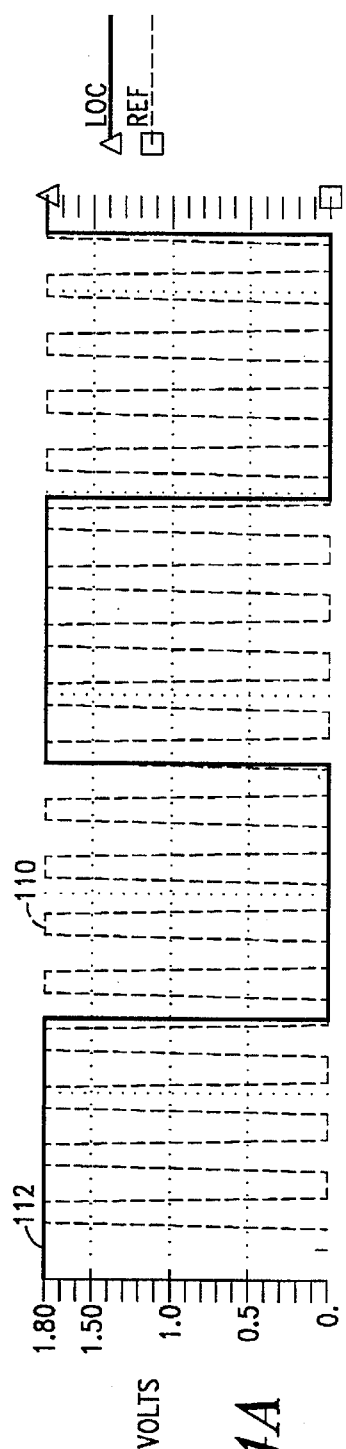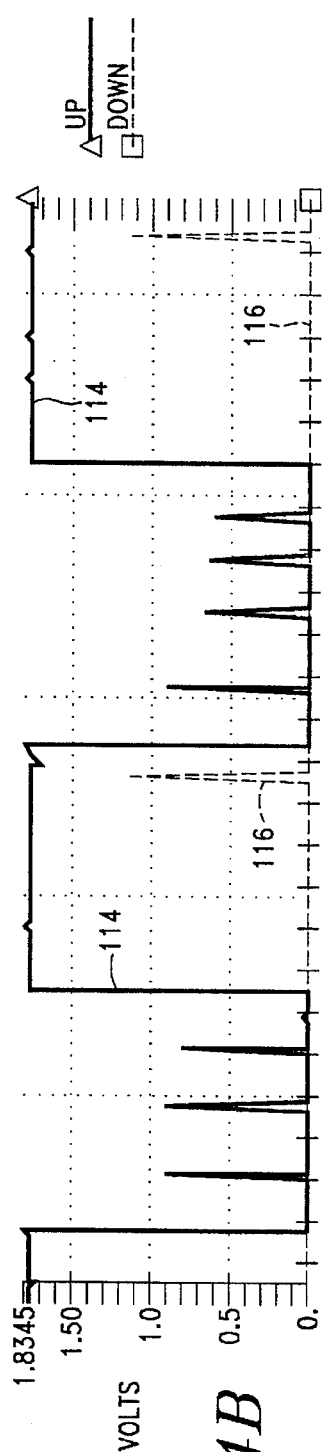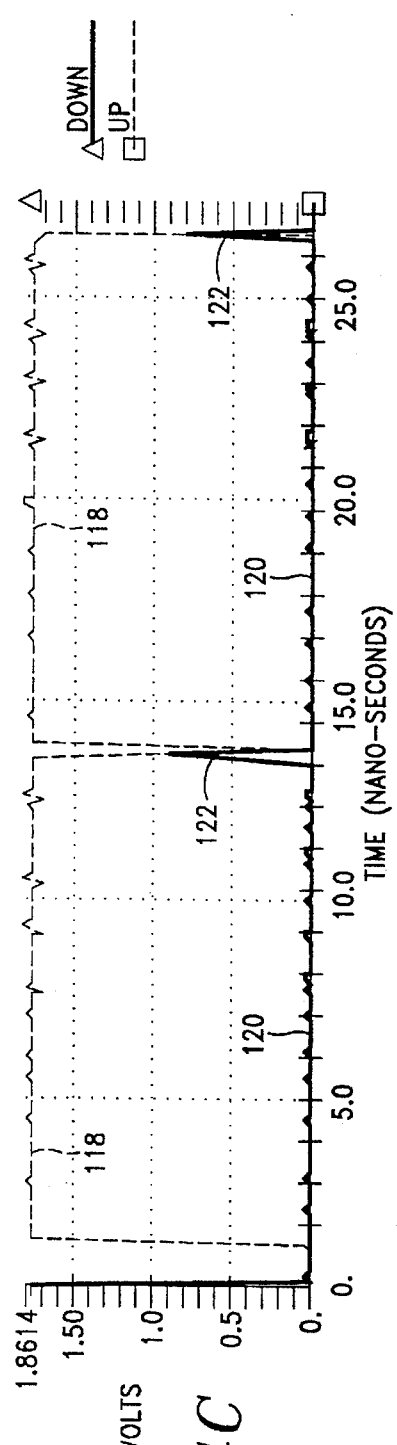
FIG.–4A
FIG.–4B
FIG.–4C

DYNAMIC PHASE-FREQUENCY DETECTOR CIRCUIT

BACKGROUND OF THE INVENTION

1. Field of the Invention

The present invention relates to a sequential phase-frequency detector circuit and more particularly to such a circuit using precharged logic and adapted for use in a CMOS delay-locked loop.

2. Background of the Invention

A modern, complex, high-speed CMOS VLSI chip often requires the use of multiple clock regeneration circuits to insure that all parts of the chip operate properly together. These clock regeneration circuits employ delay-locked and phase-locked loops to provide LOCAL clock signals which are synchronized to an external REFERENCE clock.

Each locked loop employs a sequential phase-frequency detector circuit to compare the REFERENCE and LOCAL signals and provides a pair of digital output signals ("UP" and "DOWN") having an ON duration proportional to a phase difference between the compared signals.

Typical sequential phase-frequency detectors are described in D. K. Jeong et al., "Design of PLL-Based Clock Generation Circuits," IEEE Journal of Solid State Circuits, vol. 22, no. 2, pp. 255–261, 1987, and in P. Jordan, "An Exclusive-Or Phase/Frequency Detector," Proc. RF Expo East, Atlantic City, N.J., Oct. 1989, pp. 223–229, Cardiff Pub.

Delay-locked and phase-locked loops using these sequential phase-frequency detectors suffer from excessive phase jitter at small phase differences. The jitter is caused by a region of low gain, known as the "dead zone," at the small phase differences, and prevents the use of the conventional detectors in systems requiring high clock frequencies. The conventional detectors also require many transistors for implementation in CMOS VLSI chips, making their use undesirable at high layout densities.

A sequential phase-frequency detector circuit using precharged CMOS logic for high frequency operation, having a minimum detectable phase difference of 40 pico-seconds, and requiting one third the transistors of the conventional circuits, is illustrated in FIG. 1. The circuit is described in H. Notani et al., "A 622-MHz CMOS Phase-Locked Loop with Precharge-type Phase Frequency Detector," 1994 IEEE Symposium on VLSI Circuits Digest of Technical Papers, pp. 129–130.

As shown in FIG. 1, the node 1 is precharged while the input signal REF is low, and the node 2 holds its previous value. When the signal REF goes high, the node 1 is ready to be discharged. When the input signal LOC goes high, the node 1 is discharged, which makes the UP output signal low. The UP output signal is active from the rising edge of the REF signal until the rising edge of the LOC signal. In a complementary manner, the output signal DOWN is active from a rising edge of the signal LOC to a rising edge of the signal REF.

As will be seen from an examination of FIG. 1, the UP output signal cannot be asserted when the LOC signal is stuck at a high level. The Notani et al. detector works quite well when the frequency of the system-wide REFERENCE clock and the LOCAL clock are nearly the same. This will be true, for example, when the Notani et al. detector is used in a phase-locked loop having a voltage-controlled oscillator (see FIG. 2 in Notani et al.) because the voltage-controlled oscillator will adjust its frequency to follow the system-wide REFERENCE signal over a very wide range of frequencies, insuring that the LOC input does not become stuck.

When used in a delay-locked loop employing a voltage controlled delay line, on the other hand, the Notani et al. circuit fails to assert the UP control signal when the LOC input is stuck at a high level. This result occurs because the stuck LOC input permits the node 1 to discharge when the REF input goes high. The Notani et al. circuit is therefore not suitable for use in a delay locked loop in which the output of the delay line may become stuck when the delay is longer than approximately 1.5 to 2 times the clock period of the REFERENCE input. This result is common during frequency acquisition following a return from an Energy-Star™ mode in which the frequency of the REFERENCE signal is initially significantly less than its normal operating frequency.

SUMMARY OF THE INVENTION

The sequential phase-frequency detector circuit of the present invention overcomes this disadvantage of the Notani et al. circuit by including a pulse generator triggered on a rising edge of the LOCAL signal for discharging an UP reset node. The pulse generator discharges the reset node only at a rising edge of the LOCAL signal and therefore permits the UP signal to be turned ON when the LOCAL input is stuck at a high or a low level. This feature permits the present detector to be used with a voltage controlled delay line. The present invention is implemented using precharged logic and includes significantly fewer transistors than the conventional circuits. The present invention is capable of resolving phase differences as small as one pico-second.

In another embodiment of the invention, the sequential phase-frequency detector circuit includes a second pulse generator triggered on a rising edge of the REFERENCE signal for discharging a DOWN reset node. The pulse generator discharges the node only at a rising edge of the REFERENCE signal and permits the DOWN signal to be turned ON when the REFERENCE input is stuck at a high or a low level. This embodiment is symmetrical with respect to the two input and the two output signals and provides identical capacitive loading of the input signals and additional layout flexibility in which both the inputs and the outputs are interchangeable.

Another embodiment of the invention presents a method for comparing two digital input signals and for asserting one of two output signals based upon which input signal includes a first occurrence of a predetermined switching feature and resetting the one output at a next occurrence of the switching feature in the other input signal. An ON duration of the one output signal is proportional to the time between the first and the next occurrence of the switching feature. The method includes steps providing an apparatus for the practice of the method having the pulse generator isolation feature permitting an output signal to be asserted when an input is stuck at a high or a low level.

Finally, in another embodiment, the invention comprises a CMOS clock regeneration system for providing multiphase clock output signals locked to the frequency and phase of an input clock REFERENCE signal. The clock regeneration system includes a phase-locked loop employing a voltage-controlled delay line and a sequential phase-frequency detector using precharged logic and including the isolation feature described above.

DESCRIPTION OF THE DRAWINGS

For a farther understanding of the objects, features and advantages of the present invention, reference should be had to the following description of the preferred embodiment, taken in conjunction with the accompanying drawing, in which like parts are given like reference numerals and wherein:

FIG. 4A is a waveform diagram illustrating two input signals to a phase-frequency detector during a computer simulation.

FIG. 4B is a waveform diagram illustrating computer simulated output signals for the prior art phase-frequency detector of FIG. 1 when receiving the input signals illustrated in FIG. 4A.

FIG. 4C is a waveform diagram illustrating computer simulated output signals for the phase-frequency detector of the present invention, as shown in FIG. 3, when receiving the input signals illustrated in FIG. 4A.

DESCRIPTION OF THE PREFERRED EMBODIMENT

Several common customs and definitions will prove useful to an understanding of the description which follows. Except where necessary to insure clarity, no distinction will be made between signals and the lines which carry the signals. The signal levels of digital signals will be referred to as being at a high level (or simply "high") or at a low level ("low"), as being asserted or negated, active or inactive, or being ON or OFF. A transition of a digital signal level from a low level to a high level will define a "rising edge" of the signal. A "predetermined feature" of a digital signal will include any defined transition from one level to another level, e.g., a rising edge is a predetermined feature. The phase of one digital signal with respect to another will be defined as the interval between the rising edge of the one signal with respect to the rising edge of the other signal. In comparing the phase of one digital signal with the phase of a second digital signal, one signal will be said to "lead" the other signal if the rising edge of the one signal occurs before the rising edge of the other signal, and will be said to "lag" the other signal if the rising edge of the one signal occurs after the rising edge of the other signal. A phase difference between two digital signals will be expressed as an interval of time (typically in units of "pico-seconds") corresponding to the elapsed time between the rising edge of one signal and the rising edge of the other signal.

The phrase "sequential phase-frequency detector" (or simply "phase-frequency detector") is used throughout this Specification and in the claims. As used herein, the phrase defines a circuit for comparing the phase and the frequency of two digital input signals ("REFERENCE" and "LOCAL"). When an occurrence of a predetermined switching feature (such as a rising edge) of the REFERENCE signal precedes an occurrence of the feature of the LOCAL signal, or the frequency of the REFERENCE signal is greater than the frequency of the LOCAL signal, the circuit asserts a first digital output signal ("UP") during the interval between the two occurrences. When an occurrence of the predetermined feature of the REFERENCE signal follows the occurrence of the feature of the LOCAL signal, or when the frequency of the REFERENCE signal is less than the frequency of the LOCAL signal, the circuit asserts a second digital output signal ("DOWN") during the interval between the two occurrences. Thus when the frequency of the two input signals is the same, the duration of an output signal is proportional to the phase difference between the two input signals.

Figure 2:
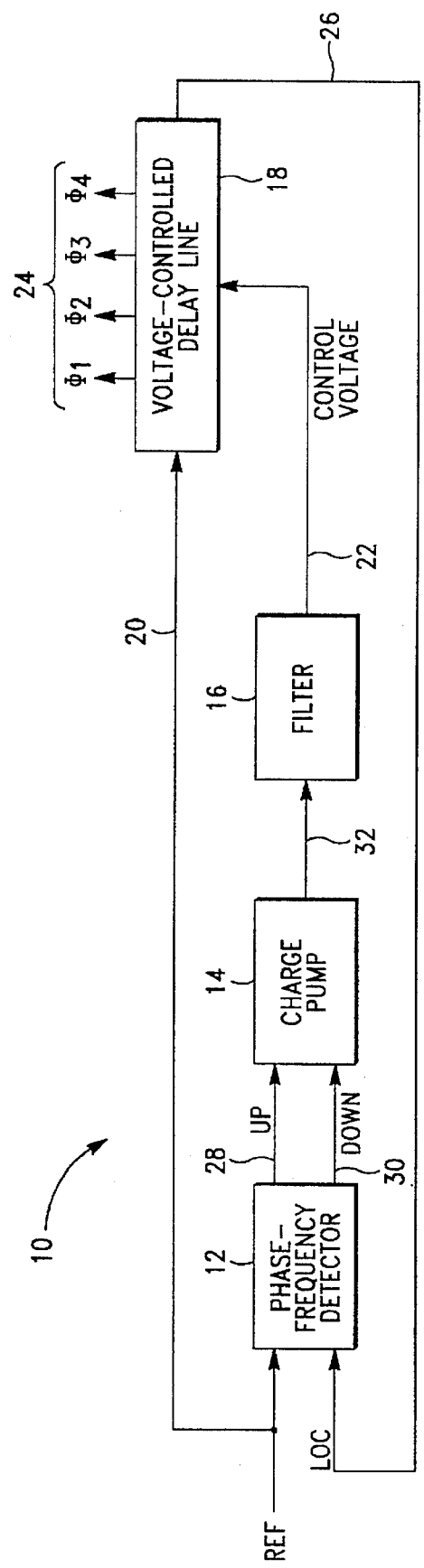
FIG. 2 is a block diagram which illustrates a delay-locked loop according to one aspect of the present invention.

With respect to FIG. 2, there is shown a delay-locked loop according to one aspect of the present invention, and designated generally by the numeral 10. The delay-locked loop 10 includes a phase-frequency detector 12, a charge pump 14, a filter 16, and a voltage-controlled delay line 18. In a preferred embodiment of the invention the delay-locked loop 10 is implemented on a single CMOS integrated circuit and is used to provide a LOCAL clock signal which, during normal operation, is locked in frequency and phase with a system-wide REFERENCE clock signal.

In a typical system application, the system-wide REFERENCE clock has a normal operating frequency and will also, at times, operate at a much lower, power-conserving frequency, such as during an Energy-Star™ or Slow mode. When the system switches from a low frequency mode of operation to normal operation, some interval of time is required for the delay-locked loop 10 to acquire frequency and phase lock with the REFERENCE clock. Under these circumstances, it is advantageous to establish an upper limit for the time required for the delay-locked loop 10 to acquire lock.

It is a characteristic of a CMOS voltage-controlled delay line (18 of FIG. 2) that when the delay is greater than approximately 1.5 to 2 times the clock period of a delay line input (20 of FIG. 2), the delay line output signals may become stuck at an always high or always low state. As noted above, when the delay line output signal LOC 26 is stuck at a high level, the UP output signal 28 cannot be turned ON. Under these circumstances, the delay-locked loop 10 falls.

The voltage-controlled delay line 18 has an adjustable delay that varies between an upper and a lower limit as a function of the voltage level of an analog control voltage received on line 22. The voltage-controlled delay line 18 receives the system-wide REFERENCE clock signal REF 20. The delay line 18 provides successively delayed digital output signals $\Phi1$, $\Phi2$, $\Phi3$, $\Phi4$, designated generally by the numeral 24. The delay line 18 also provides a digital output signal LOC 25. The signal LOC is delayed by the full adjustable delay of the delay line 18. In a preferred embodiment of the delay-locked loop 10, the full adjustable delay of the delay line 18 is equal to the duration of a single clock period of the signal REF 20 at the normal operating frequency.

The phase-frequency detector 12 receives the system-wide REFERENCE clock signal REF 20 and the delay line digital output signal LOC 26. The phase-frequency detector 12 compares the phase and the frequency of the two signals REF and LOC and provides digital control output signals UP 28 and DOWN 30 in response to the comparison.

The charge pump 14 receives the digital control signals UP 28 and DOWN 30 and provides an output on line 32 for driving the filter 16, typically a large integrated circuit capacitor connected between line 32 and ground. The filter provides the analog control voltage 22 for adjusting the delay of the delay line 18 to maintain a frequency and phase lock between the system-wide REFERENCE clock signal REF 20 and the delay line output signal LOC 26.

The charge pump 14, the filter 16 and the voltage-controlled delay line 18 are known in the art and the manner in which these parts function in general to form a delay-locked loop 10 will not be discussed further except where necessary to make clear some aspect of the phase-frequency detector 12, the subject of the present invention.

The novel phase-frequency detector 12 is capable of bringing the loop 10 to frequency and phase lock with the system-wide REFERENCE clock signal REF 20 within a predetermined number of system clock intervals following a return from the Energy-Star™ or Slow mode.

It will be understood by those skilled in the art that a phase-locked loop using a voltage-controlled oscillator for providing the signal LOC will also use a phase-frequency detector 12, charge pump 14, filter 16 for providing an analog control voltage 22 for control of the voltage controlled oscillator. The present invention will work successfully with such a voltage-controlled oscillator, but the particular advantages of the present invention become apparent when it is used with the CMOS voltage-controlled delay line 18 in which the output signal LOC 26 remains stuck during a recovery from a low-frequency mode of operation until the delay line delay is less than about 1.5 to 2 times a clock period of the system-wide REFERENCE signal.

Figure 3:
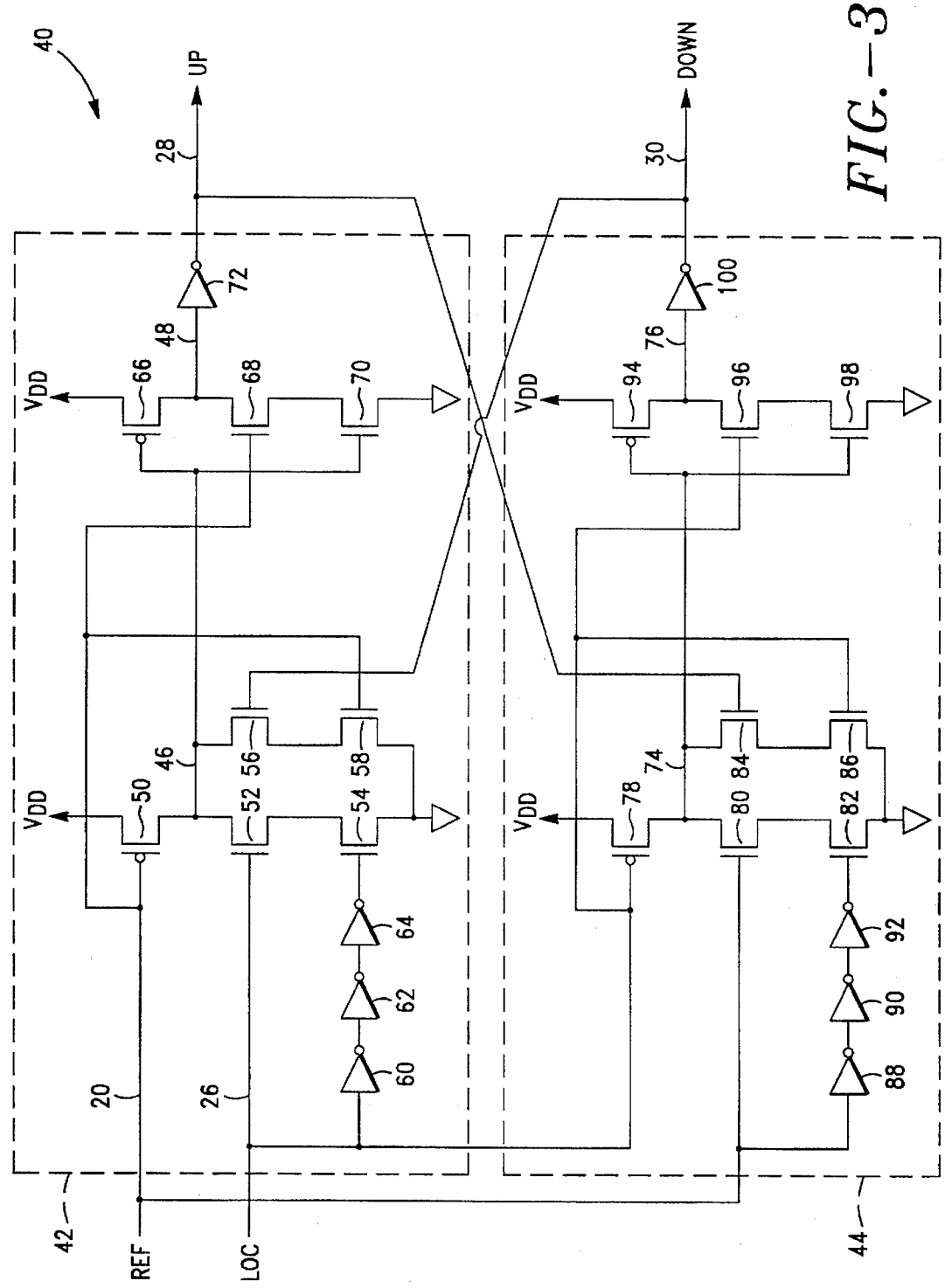
FIG. 3 is a schematic diagram illustrating a dynamic CMOS phase-frequency detector according to another aspect of the present invention.

A schematic diagram of a preferred embodiment of the phase-frequency detector of the present invention is shown in FIG. 3. The phase-frequency detector is designated generally by the numeral 40.

The phase-frequency detector 40 receives the system-wide REFERENCE clock signal REF 20 and the delayed REFERENCE signal LOC 26, and provides two digital control output signals UP 28 and DOWN 30, corresponding to the phase-frequency detector circuit 12 of FIG. 2.

The phase-frequency detector circuit 40 includes cross-coupled first and second two-stage dynamic CMOS logic circuits 42, 44. The first dynamic circuit 42 receives the signal REF 20, the signal LOC 26 and the signal DOWN 30, and provides the digital control signal UP 28. The second dynamic circuit 44 receives the signal REF 20, the signal LOC 26 and the signal UP 28, and provides the digital control signal DOWN 30.

The first two-stage dynamic CMOS circuit 42 includes a first dynamic node 46 and a second dynamic node 48. The first dynamic node 46 is precharged through a P-type CMOS transistor 50 when the signal REF 20 is low. The first dynamic node 46 is connected to a first pair of series-connected N-type CMOS discharge transistors 52 and 54, and to a second pair of series-connected N-type CMOS discharge transistors 56 and 58. The discharge transistor 52 is controlled directly by the signal LOC 26. The signal LOC 26 is connected through a series-connected group of CMOS inverters 60, 62 and 64 to control the discharge transistor 54. The discharge transistor 56 is controlled by the cross-coupled signal DOWN 30, and the discharge transistor 58 is controlled by the signal REF 20.

The series connected discharge transistors 52, 54 and the series connected inverters 60, 62, 64 operate to discharge the first dynamic node at a rising edge of the signal LOC 26. When the signal LOC is low, the transistor 54 is turned on because the odd number of inverters 60, 62, 64 provides a high level at the gate of transistor 54. When the signal LOC 26 goes high, the transistor 52 turns on and the delay through the odd number of inverters 60, 62, 64 prevents the immediate turning off of the transistor 54. Therefore the first dynamic node 46 is discharged. After a short delay, the signal at the gate of the transistor 54 goes low and the discharge path through the transistors 52, 54 is disconnected. Thus the first dynamic node 46 is discharged at a rising edge of the signal LOC 26. The two discharge transistors 52, 54 and the odd number of series connected inverters 60, 62, 64 define a pulse generator connected to discharge the node 46 at a rising edge of the signal LOC 26.

In normal operation, the first dynamic node 46 is precharged when the signal REF 20 is low, and is discharged when the signal REF 20 is high and at least one of the following occurs: the rising edge of the signal LOC 26, or alternatively, the cross-coupled signal DOWN 30 is high. The cross-coupled term insures that the circuit 40 operates as a frequency detector when the frequencies of the two input signals are not approximately equal.

In a preferred embodiment, there are three series connected inverters 60, 62, 64 in the first dynamic CMOS circuit 42. However, it will be clear to a person having an ordinarily level of skill in the art that the number of series connected inverters can be a different odd number, including one inverter. A greater odd number of inverters will cause the pulse generator to provide a longer discharge pulse for the node 46.

The second dynamic node 48 is precharged through a P-type CMOS transistor 66 when the first dynamic node is low. The second dynamic node 48 is connected to a third pair of series-connected N-type CMOS discharge transistors 68 and 70. The discharge transistor 68 is turned on when the signal REF 20 is high, and the discharge transistor 70 is turned on when the first dynamic node 46 is high. Therefore, the second dynamic node 48 is precharged when the first dynamic node 46 is low, and is discharged when the signal REF 20 is high and when the first dynamic node 46 is high.

The second dynamic node 48 is connected to the input of an inverter 72. The output of the inverter 72 provides the digital control signal UP 28.

In a normal operation in which the frequency Of the REF signal 20 and of the LOC signal 26 are about equal, the output signal UP 28 is asserted when the signal REF 20 goes high before the signal LOC 26 goes high, and the duration of the UP signal is from the leading edge of the signal REF to the leading edge of the signal LOC. Thus the duration or "width" of the UP signal 28 is proportional to the phase difference between the signals REF and LOC. A wide UP signal corresponds to a large phase difference, while a narrow UP signal corresponds to a small phase difference. The UP control signal 28 is used to command a decrease in the delay of the delay line 18 (FIG. 2).

The second two-stage dynamic CMOS circuit 44 includes a third dynamic node 74 and a second dynamic node 76. The third dynamic node 74 is precharged through a P-type CMOS transistor 78 when the signal LOC 26 is low. The third dynamic node 74 is connected to a fourth pair of series-connected N-type CMOS discharge transistors 80 and 82, and to a fifth pair of series-connected N-type CMOS discharge transistors 84 and 86. The discharge transistor 80 is controlled directly by the signal REF 20. The signal REF 20 is connected through a series-connected group of CMOS inverters 88, 90 and 92 to control the discharge transistor 82. The discharge transistor 84 is controlled by the cross-coupled signal UP 28, and the discharge transistor 86 is controlled by the signal LOC 26.

In normal operation, the third dynamic node 74 is precharged when the signal LOC 26 is low, and is discharged when the signal LOC 26 is high and at least one of the following occurs: the rising edge of the signal REF 20, or alternatively, the cross-coupled signal UP 28 is high.

In a preferred embodiment, there are three series connected inverters 88, 90, 92 in the second dynamic CMOS circuit 44. However, it will be clear to a person having an ordinarily level of skill in the art that the number of series connected inverters can be a different odd number, including one inverter. The odd number of inverters 88, 90, 92 and the two discharge transistors 80, 82 define another pulse generator connected to discharge the node 74. A greater odd number of inverters will result in a longer discharge pulse at node 74 for a rising edge of the signal REF 20.

The fourth dynamic node 76 is precharged through a P-type CMOS transistor 94 when the third dynamic node is low. The fourth dynamic node 76 is connected to a sixth pair of series-connected N-type CMOS discharge transistors 96 and 98. The discharge transistor 96 is turned on when the signal LOC 26 is high, and the discharge transistor 98 is turned on when the third dynamic node 74 is high. Therefore, the fourth dynamic node 76 is precharged when the third dynamic node 74 is low, and is discharged when the signal LOC 26 is high and when the third dynamic node 74 is high.

The fourth dynamic node 76 is connected to the input of an inverter 100. The output of the inverter 100 provides the digital control signal DOWN 30.

In a normal operation in which the frequency of the REF signal 20 and of the LOC signal 26 are about equal, the output signal DOWN 30 is asserted when the signal LOC 26 goes high before the signal REF 20 goes high, and the duration of the DOWN signal is from the leading edge of the signal LOC to the leading edge of the signal REF. Thus the duration or "width" of the DOWN signal 30 is proportional to the phase difference between the signals LOC and REF. A wide DOWN signal corresponds to a large phase difference, while a narrow DOWN signal corresponds to a small phase difference. The DOWN control signal 30 is used to command an increase in the delay of the delay line 18 (FIG. 2).

In a preferred embodiment of the delay locked loop 10 of FIG. 2, the phase-frequency detector 12 is configured to permit the assertion of the UP output 28 independently of the LOC input signal level 26, and includes a pulse generator connected to reset the UP output 28 and triggered on a rising edge of the LOC input signal 26 (see FIG. 3).

In another embodiment of the delay locked loop 10, including the phase-frequency detector described in the preceding paragraph, a plurality of delay locked loops are implemented on a single CMOS integrated circuit, all having the REF 20 input connected to the system-wide REFERENCE clock signal.

In an ideal sequential phase-frequency detector 40, the UP and the DOWN outputs are never active at the same time. When the phase of REF leads the phase of LOC, the duration of the active interval of Up is proportional to the difference between the phases. When the phase-difference is zero, both output signals are inactive. When the phase of REF lags the phase of LOC, the duration of the active interval of DOWN is proportional to the difference between the phases. When the frequencies are not the same, if the frequency of REF is greater than the frequency of LOC, the UP signal is continuously active. If the frequency of REF is less than the frequency of LOC, the DOWN signal is continuously active.

Actual operation of the circuit 40 is somewhat more complex, however. Consider the case when starting from rest. Assume REF and LOC are initially low. Nodes 46 and 74 will be high. If by chance, either or both of UP and DOWN are high, then nodes 48 and 76 are low. PMOS transistors being leakier than NMOS, with the passage of time nodes 48 and 76 charge to a high level, and UP and DOWN become low. This then is the condition defined as "being at rest."

Assume a rising edge of REF occurs while the circuit 40 is at rest. The transistor 50 is shut off, and transistor 68 is tamed on, discharging node 48. UP becomes active. Node 74 gets a discharging spike, and after a slight fight will return to a high level. This discharging spike will reinforce node 76 to a high level, keeping DOWN low. Thus, a rising edge at REF when UP is low and DOWN is low will set UP and reinforce DOWN to a low level.

Next, assume that while REF and UP are both high, LOC goes high also. Node 46 will get discharged, turning on transistor 66, charging node 48 and UP will be reset. Node 74 will tend to get discharged because transistor 86 will turn on for a short while. If node 74 gets discharged, transistor 94 rams on keeping node 76 high and DOWN low.

Consider the situation now in which the signal REF is periodically rising and falling in the manner of a clock signal. UP is high. When REF falls, node 46 remains precharged. Transistor 68 gets cutoff. Node 48 remains low. UP remains high. Assume that the clock period of REF is short enough so that the leaky PMOS transistor 66 does not have time to charge node 48 to a high level. When LOC rises, node 46 tends to get discharged, but after fighting, remains at a high level. This results in a spike which will reset UP by charging node 48 through transistor 66. Before UP fully resets, LOC going to a high level will have reset node 74 (transistors 84, 86 being on for a short while) keeping node 76 high and the output DOWN at a low level. Thus, a rising edge of LOC when UP is high will reset UP and reinforce DOWN to a low level.

A related sequence of events occurs when the complementary situation occurs and a rising edge of REF lags a rising edge of LOC while DOWN is high and UP is low.

Thus, it is shown that in a real circuit 40, the UP and the DOWN outputs may both be active at the same time for brief intervals. This circuit behavior is borne out in a discussion of a computer simulation, which follows.

Figure 1:
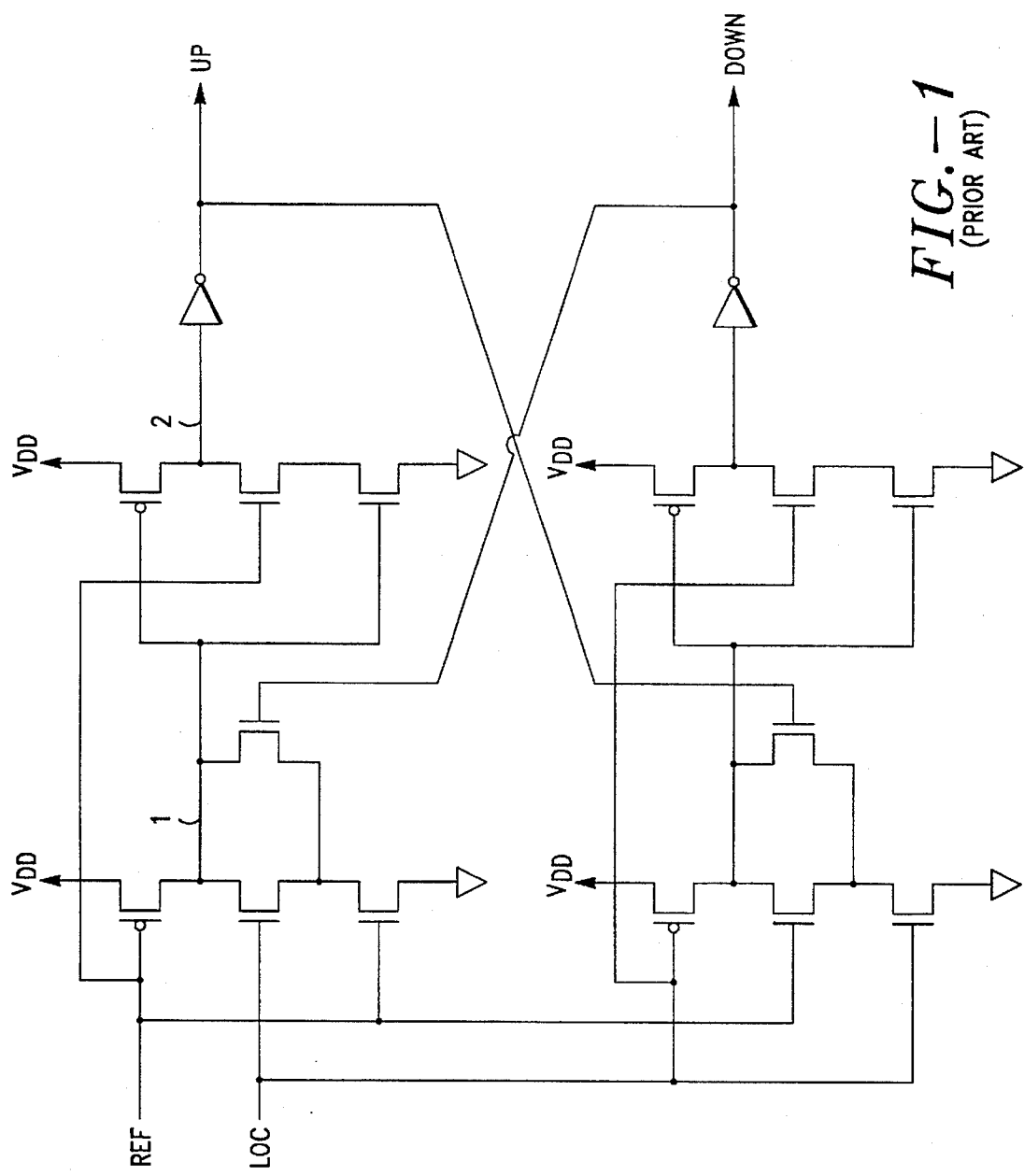
FIG. 1 is a schematic diagram of a prior art dynamic CMOS phase-frequency detector.

FIGS. 4A, 4B and 4C are waveform diagrams illustrating the results of a computer simulation comparing the performance of the Notani et al. phase-frequency detector of FIG. 1 with the performance of the phase-frequency detector according to the present invention, as shown in FIG. 3. The three waveform diagrams share a common horizontal axis (shown along the bottom of FIG. 4C) depicting elapsed time in nano-seconds measured from the left-hand side of the diagrams. Time increases moving from left to right. Each diagram has a separate vertical axis at the left-hand side, representing signal voltage level in volts.

FIG. 4A illustrates the waveforms of input signals REF 110 (broken line) and LOC 112 (solid line) to a phase-frequency detector such as the detector 12 used in a delay-locked loop of FIG. 2. For purposes of this illustration, the frequency of signal REF 110 is approximately eight times the frequency of the signal LOC 112.

FIG. 4B illustrates the response of the two digital output signals UP 114 (solid line) and DOWN 116 (broken line) of the Notani et al. circuit of FIG. 1 in response to the input signals shown in FIG. 4A.

FIG. 4C illustrates the response of the two digital output signals UP 118 (broken line) and DOWN 120 (solid line) of the phase-frequency detector according to the present invention (FIG. 3) in response to the input signals shown in FIG. 4A.

Following the increase of the frequency of the signal REF 110 from the Energy-Star™ mode to the normal operating mode, which occurs instantaneously, the closed loop illustrated in FIG. 2 must adjust the analog control voltage 22 to decrease the delay of the delay line 18 until the delay matches the duration of a single REF clock period. Ideally during this period of delay adjustment, the UP control signal 114 of FIG. 4B will remain asserted most of the time, while the DOWN control signal 116 will remain OFF. In this way the analog control voltage will be adjusted to decrease the delay in as short a time as possible.

FIG. 4B reveals however that for the Notani et al. circuit of FIG. 1, the UP signal is turned OFF when the signal LOC 112 is high. As mentioned above, during a return to normal operation from an Energy-Star™ or Slow mode, the LOC 112 signal can be stuck at a HIGH or at a LOW level until the control voltage (22 of FIG. 2) adjusts the delay so that it is less than about 1.5 to 2 times the clock period of the REF 110 input signal. It is desirable to have the UP signal active for most of the time during which LOC is stuck. This illustrated simulation demonstrates that the Notani et al. circuit asserts the UP signal when LOC is low, but is unable to do so when LOC is high. This outcome results in the delay acquisition phase taking much longer than is desirable. In some instances, the loop will fail to adjust the control voltage (22 of FIG. 2) and the loop will never lock.

FIG. 4C reveals that the use of the pulse generators in the phase-frequency detector circuit 40 of the present invention (FIG. 3) isolate the node 46 from the signal LOC (26 of FIG. 3) and permits the UP control signal (118 of FIG. 4C) to be asserted while the LOC signal 112 is high, so that UP is true most of the time during the transition from the Energy-Star™ mode to a normal operating mode. The DOWN control signal 120 remains OFF except for an occasional switching transient 122. This desirable result permits the delay of the delay line to be decreased in a predictably short time, making the phase-frequency detector 40 (FIG. 3) useful in its intended application.

Figure 5:
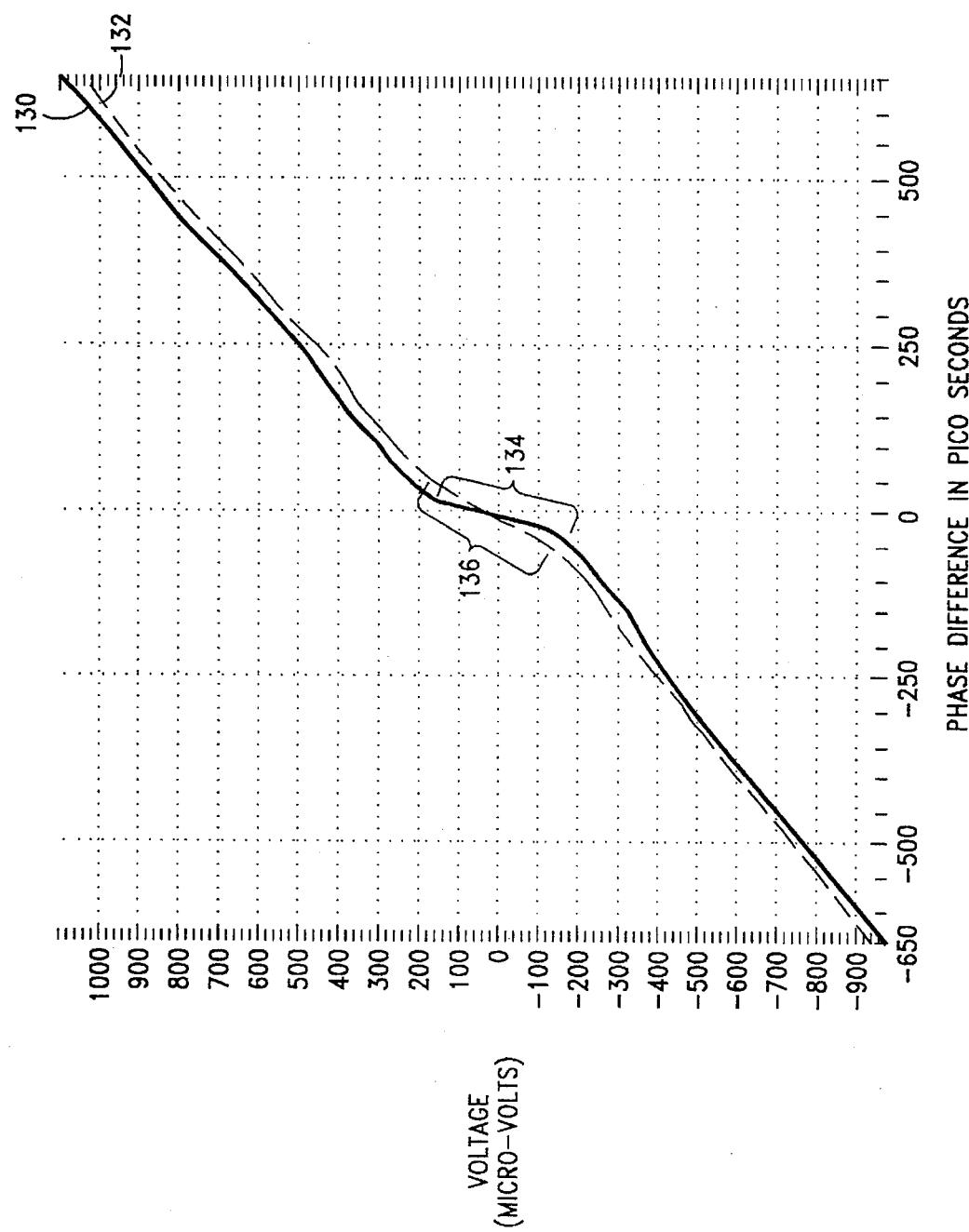
FIG. 5 is a graph illustrating control-voltage-versus-phase-difference curves during a computer simulation of the prior art phase-frequency detector of FIG. 1 and the phase-frequency detector circuit of FIG. 3.

FIG. 5 is a graph illustrating control-voltage-versus-phase-difference ("characteristic") curves for the Notani et al. prior art phase-frequency detector of FIG. 1 and for the phase-frequency detector circuit according to the present invention (FIG. 3). A phase-difference expressed in pico-seconds is shown along the horizontal axis, and a control-voltage level expressed in micro-volts is shown along the vertical axis. The 0—0 point is located at the center of the graph. The data represented was developed by an open-loop computer simulation of the two circuits. In this simulation, a fixed frequency signal was applied to one input of the phase-frequency detector 12 in FIG. 2 and the phase of the signal, with respect to the one input, was varied as it was applied to the other input. The analog control voltage 22 across a capacitor simulating the filter 16 was determined and is represented along the vertical axis of FIG. 5.

The size of the capacitor was selected to accurately represent the response of the circuit as the input phase was varied. Without loss of generality, in an actual delay locked loop, the capacitor in the filter 16 would be much larger than the capacitor used in the simulation and the resulting voltage levels would be correspondingly smaller. As described previously, it is common in the high frequency phase-locked loop field to express a phase difference in terms of an elapsed time between the leading edges (or other selected features) of a pair of compared waveforms. That custom is followed here.

The characteristic curve for the phase-frequency detector circuit according to one aspect of the present invention, as shown in FIG. 3, is illustrated using a solid line 130, while the curve for the Notani et al. circuit of FIG. 1 is shown using a broken line 132.

An examination of the two characteristic curves 130, 132 reveals that both curves include two regions of operation, or gain. The curve represented by the solid curve 130 for the present invention has a region of high gain 134 between approximately +/−20 pico-seconds of phase difference, and a region of lower gain at larger absolute phase differences. The high gain region 134 has a response of approximately 7, while the region of lower gain has a response of approximately 1.

The curve represented by the broken line 132 for the Notani et al. prior art circuit has a region of high gain 136 between approximately +/−50 pico-seconds of phase difference, and a region of lower gain at larger absolute phase differences. The high gain region 136 has a response of approximately 3.25, while the region of lower gain has a response approximately the same as for the new circuit.

The improved response of the present invention reduces jitter at low phase differences resulting in a clock regeneration circuit capable of use at higher frequencies.

While the invention has been described in relation to the embodiments shown in the accompanying Figures, other embodiments, alternatives and modifications will be apparent to those skilled in the art. It is intended that the specification be only exemplary, and that the true scope and spirit of the invention be indicated by the following claims.

What is claimed is:

1. A sequential phase-frequency detector having REFERENCE and LOCAL inputs and UP and DOWN outputs, the detector including a first pulse generator triggered on the rising edge of the LOCAL input for resetting the UP output and for permitting the assertion of the UP output when the LOCAL input is stuck at a high level.

2. The sequential phase-frequency detector as set forth in claim 1, being implemented using precharged logic.

3. The sequential phase-frequency detector as set forth in claim 1, further including a second pulse generator triggered on the rising edge of the REFERENCE input for resetting the DOWN output and for permitting the assertion of the DOWN output when the REFERENCE input is stuck at a high level.

4. The sequential phase-frequency detector as set forth in claim 3, further comprising:

a first dynamic node connected for precharging when the REFERENCE input is low and connected for discharging when the first pulse generator is triggered;

a second dynamic node connected for precharging when the first dynamic node is low and connected for discharging when the REFERENCE input is high and the first dynamic node is high;

a first inverter having an input connected to the second dynamic node and an output connected for supplying the UP output;

a third dynamic node connected for precharging when the LOCAL input is low and connected for discharging when the second pulse generator is triggered;

a fourth dynamic node connected for precharging when the third dynamic node is low and connected for discharging when the LOCAL input is high and the third dynamic node is high;

a second inverter having an input connected to the fourth dynamic node and an output connected for supplying the DOWN output.

5. The sequential phase-frequency detector as set forth in claim 4, wherein the first pulse generator includes two N-type CMOS transistors series connected between the first dynamic node and ground, the gate of one transistor being connected to the LOCAL input and the gate of the other transistor being connected to the LOCAL input delayed through an odd number of inverters, thereby permitting the discharge of the first dynamic node by a rising edge of the LOCAL input.

6. The sequential phase-frequency detector as set forth in claim 5, wherein the odd number of inverters includes at least one inverter.

7. The sequential phase-frequency detector as set forth in claim 4, wherein the second pulse generator includes two N-type CMOS transistors series connected between the third dynamic node and ground, the gate of one transistor being connected to the REFERENCE input and the gate of the other transistor being connected to the REFERENCE input delayed through an odd number of inverters, thereby permitting the discharge of the third dynamic node by a rising edge of the REFERENCE input.

8. The sequential phase-frequency detector as set forth in claim 7, wherein the odd number of inverters includes at least one inverter.

9. A method for comparing two digital input signals and for turning ON one of two digital output signals based upon which input signal includes a first occurrence of a predetermined feature and turning OFF said one output signal at a next occurrence of said feature in the other input signal, such that an ON duration of the one output signal is proportional to a time interval between said first and next occurrences of the predetermined feature, the method comprising the steps of:

providing the two digital input signals, and defining one input signal as a REFERENCE input and the other input signal as a LOCAL input;

providing means for generating two digital output signals, and defining one output signal as an UP signal and the other output signal as a DOWN signal;

providing a two-state sequential machine connected for determining a first and a next occurrence of the predetermined feature;

responding to a first occurrence of the predetermined feature on the REFERENCE input by turning ON the UP output signal independent of the LOCAL input;

providing a pulse generator connected for turning OFF the UP output signal, and triggered at an occurrence of the predetermined feature of the LOCAL input;

responding to an occurrence of the predetermined feature on the LOCAL input by triggering the pulse generator, thereby turning OFF the UP output signal;

responding to a first occurrence of the predetermined feature on the LOCAL input by turning ON the DOWN output signal; and responding to a next occurrence of the predetermined feature on the REFERENCE input by turning OFF the DOWN output signal.

10. The method as set forth in claim 9, wherein the predetermined feature defines a rising edge for each digital input signal.

11. The method as set forth in claim 9, further including the steps of:

providing a second pulse generator connected for turning OFF the DOWN output signal, and triggered at an occurrence of the predetermined feature on the REFERENCE input;

the step of responding to a first occurrence of the predetermined feature on the LOCAL input by turning ON the DOWN output signal, further including being independent of the REFERENCE input; and the step of responding to a next occurrence of the predetermined feature on the REFERENCE input by turning OFF the DOWN output signal, further including triggering the second pulse generator, thereby turning OFF the DOWN output signal, whereby the method becomes symmetrical with respect to the input and output signals such that an interchange of the two inputs and the two outputs produces the same result in operation.

12. The method as set forth in claim 9 being practiced using precharged CMOS logic.

13. The method as set forth in claim 12, being practiced on a plurality of independent implementations within a single integrated circuit.

14. The method as set forth in claim 11 being practiced using precharged CMOS logic.

15. The method as set forth in claim 14 being practiced on a plurality of independent implementations within a single integrated circuit.

16. A CMOS clock regeneration system for providing multi-phase clock output signals locked to the frequency and phase of an input clock REFERENCE signal, having a signal interval, the clock regeneration system comprising:

a voltage-controlled delay line having an input for receiving the REFERENCE signal, a digital output corresponding to a fully delayed REFERENCE signal, an analog control voltage input line for adjusting the duration of the full delay in proportion to the analog Control voltage, and a plurality of intermediate digital outputs corresponding to successively delayed REFERENCE signals defining the multi-phase clock output signals;

a sequential phase-frequency detector circuit using precharged logic and having a first input connected to the REFERENCE signal and a second input connected to the fully delayed delay line output signal, the phase-frequency detector providing an UP digital control signal and a DOWN digital control signal, the phase-frequency detector circuit being configured to assert the UP signal at a rising edge of the REFERENCE signal, independent of the level of the fully delayed delay line output signal, and including a pulse-generator connected to reset the UP output, and triggered on a rising edge of the fully delayed delay line output signal, and independent of the level of the REFERENCE signal;

a charge-pump circuit connected to receive the UP and DOWN control signals and to control a current in response to the control signals and for coupling the controlled current to an output line; and a filter circuit including a capacitor connected to receive the controlled current for providing a filtered control voltage to the analog control voltage input line of the voltage-controlled delay line, whereby the phase-frequency detector operates to adjust the full delay to correspond to the duration of one cycle of the REFERENCE signal and the intermediate delay line outputs provide successively delayed clock output signals locked to the frequency and phase of the REFERENCE signal.

17. The clock regeneration system as set forth in claim 16, being implemented on a single integrated circuit.

18. The clock regeneration system as set forth in claim 17, wherein a plurality of such systems are implemented on a single integrated circuit.

19. The clock regeneration system as set forth in claim 18, wherein each system receives the REFERENCE signal.

* * * * *